United States Patent [19]

Yamada et al.

[11] Patent Number: 5,686,851

[45] Date of Patent: Nov. 11, 1997

[54] VARIABLE DELAY CIRCUIT

[75] Inventors: Hiroyuki Yamada; Shouhei Seki, both of Tokyo, Japan

[73] Assignee: Oki Electric Industry Co., Ltd., Tokyo, Japan

[21] Appl. No.: 539,685

[22] Filed: Oct. 5, 1995

[30] Foreign Application Priority Data

Oct. 24, 1994 [JP] Japan .................................. 6-258185

[51] Int. Cl.[6] .............................. H03K 3/29; H03K 17/16
[52] U.S. Cl. .......................... 327/270; 327/285; 327/219; 327/374
[58] Field of Search .................................. 327/374–377, 327/379, 383, 199, 202, 203, 208–212, 214, 218, 219–222, 430, 431, 270, 269–271, 272, 274, 284, 285, 287, 288, 51, 54, 55, 57, 65, 67, 263, 264

[56] References Cited

U.S. PATENT DOCUMENTS

| | | | |
|---|---|---|---|
| 3,821,719 | 6/1974 | Taniguchi et al. | 327/219 |
| 3,982,196 | 9/1976 | Poujois | 327/222 |
| 4,593,214 | 6/1986 | Proebsting | 327/390 |
| 4,837,465 | 6/1989 | Rubinstein | 327/203 |
| 4,864,544 | 9/1989 | Spak et al. | 327/203 |
| 5,025,174 | 6/1991 | Shikata | 327/203 |
| 5,140,179 | 8/1992 | Takano | 327/203 |
| 5,173,870 | 12/1992 | Sukashita et al. | 327/208 |
| 5,212,411 | 5/1993 | Asazawa | 327/203 |
| 5,281,865 | 1/1994 | Yamashita et al. | 327/208 |
| 5,406,135 | 4/1995 | Kasai et al. | 327/208 |
| 5,495,195 | 2/1996 | Fontana et al. | 327/379 |

FOREIGN PATENT DOCUMENTS 0463 854 A1  1/1992  European Pat. Off. .

OTHER PUBLICATIONS

K. Tanaka et al, "A GaAs DCFL Variable Delay Circuit for 2.5 GHz" paper presented at the 1991 Spring meeting of the Institute of Electronics, Information and Communication Engineers of Japan (Mar. 1991), p. 5–106.

Primary Examiner—Timothy P. Callahan
Assistant Examiner—Eunja Shin
Attorney, Agent, or Firm—Rabin, Champagne & Lynt, P.C.

[57] ABSTRACT

A variable delay circuit capable of changing delay time includes a latch circuit constituted of a pair of inverters cross-coupled to each other and a transistor serving for reducing voltage difference between two inputs of the latch circuit based on a control signal given thereto. The control signal is also supplied to a pair of transfer gates to control the delay time of the variable delay circuit. The latch circuit has two inputs, between which the transistor is coupled, coupled to the respective transfer gates' ends, at which buffers are respectively coupled to feed output signals. When the control signal reaches a high level, the state of the transistor becomes one of low impedance, so that the voltage difference between the two inputs of the latch circuit is reduced, and so that the state of the latch circuit can be quickly and easily changed with little energy. The variable delay circuit can set the minimum delay time smaller than that of the conventional circuit, which allows the variable range of delay time to be wider.

10 Claims, 4 Drawing Sheets

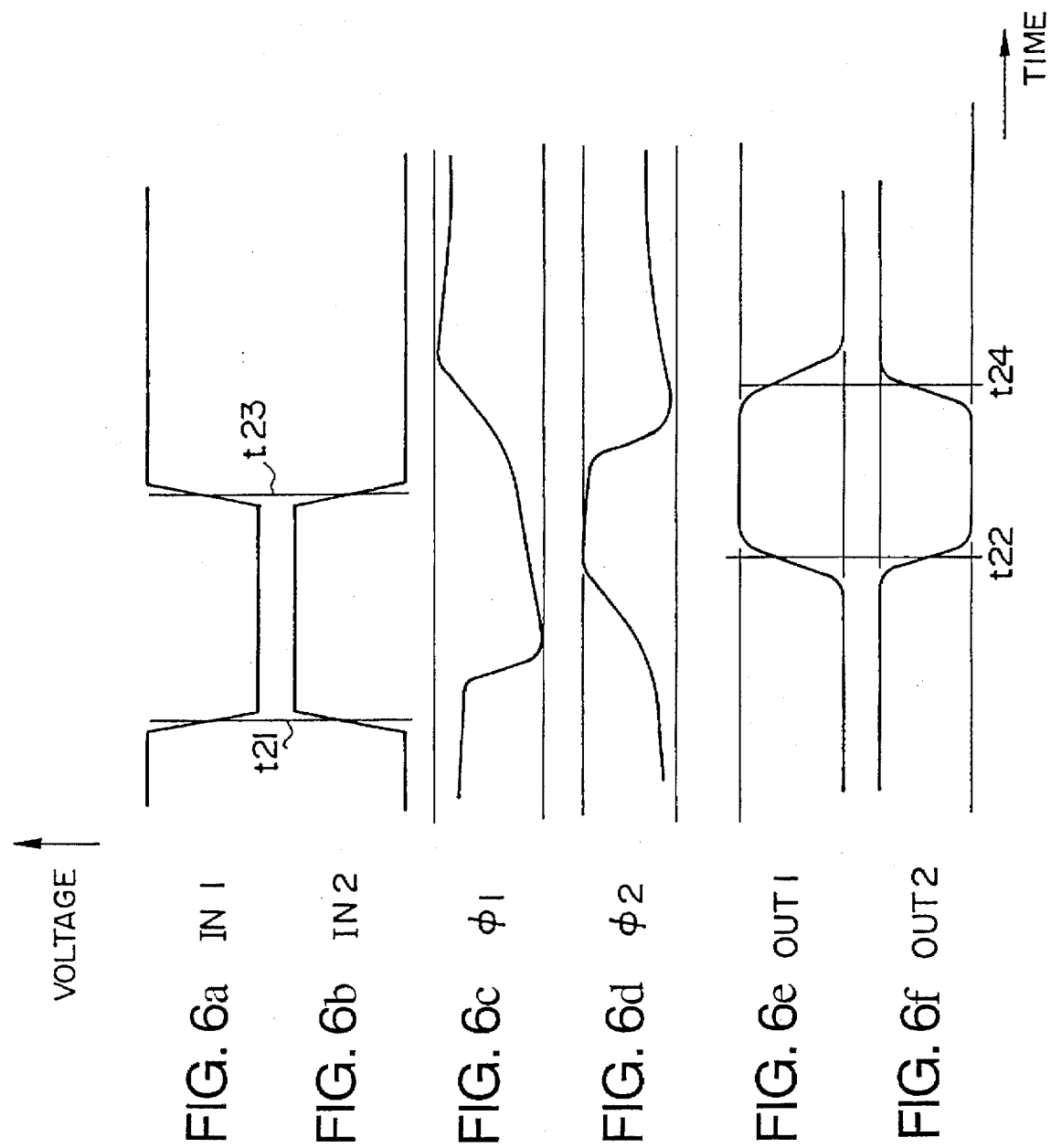

VARIABLE DELAY CIRCUIT

REFERENCE TO THE RELATED APPLICATION

This application claims the priority right under 35 U.S.C 119, of Japanese Patent Application No. Hei 06-258185 filed on Oct. 24, 1994, the entire disclosure of which is incorporated herein by reference.

BACKGROUND OF THE INVENTION

1. Field of the Invention

This invention relates to a variable delay circuit, in which a signal's phase can be adjusted with sub-nanosecond variable delay, particularly for high speed digital integrated circuits.

2. Description of the Related Art

A conventional variable delay circuit is disclosed in "A GaAs DCFL Variable Delay Circuit for 2.5 GHz," K. Tanaka, et al., Paper, page 5–106, 1991 Spring Meeting of the Institute of Electronics, Information and Communication Engineers of Japan, March 1991.

FIG. 1 shows the conventional variable delay circuit disclosed in the paper above. The variable delay circuit has a pair of inverters 1, 2 whose outputs constitute logical complements of one another. A latch circuit 3, composed of a flip-flop, is coupled between the inputs of the inverters 1, 2. The inputs of the inverters 1, 2 are coupled to input terminals 6, 7 through transfer gates 4, 5, respectively. Each transfer gate 4, 5 is consists of an enhancement type Field Effect Transistor ("E-FET") and a depletion type Field Effect Transistor ("D-FET"). The gate of the D-FET is coupled to the ground level whereas the gate of the E-FET is coupled to a delay control terminal 8 that receives a control signal CT. The impedance of the transfer gates 4, 5 is changed according to the level of the control signal CT. When the transfer gate 4, 5 have large impedance, a signal passing through the variable delay circuit is much delayed; when the transfer gates 4, 5 have small impedance, the signal is less delayed.

However, such a conventional variable delay circuit raises the following problems. First, only E-FETs of the transfer gates 4, 5 control the delay time, so that it is difficult to obtain an adequate range of delay time to be changed. Second, where the latch circuit 3 stores input signals constituting logical complements of one another with respective transition times, the delay circuit may not deliver its outputs at the same time even if the input signals are fed simultaneously. Finally, each inverter is constituted of two FETs, so that the variable delay circuit is constituted of twelve FETs. It is therefore difficult to make the variable delay circuit compact when a chip on which such a circuit is to be formed is highly integrated.

SUMMARY OF THE INVENTION

It is an object of the invention to provide a variable delay circuit having an adequate range of delay time, being able to deliver its two complementary outputs without time differences therebetween, and being made compact even when formed on a chip highly integrated.

The variable delay circuit according to the invention includes a pair of transfer gates controlled to change their impedance based on a control signal, a latch circuit composed of a pair of inverters cross-coupled to each other and respectively coupled to the transfer gates through two inputs thereof, a pair of buffers for feeding output signals, each of which is coupled to the transfer gate, and a transistor coupled between the two inputs of the latch circuit for controlling, according to the control signal, time needed for changing the state of the latch circuit. The transistor can set the minimum delay time smaller than that of the conventional circuit, thereby allowing the variable range of the delay time to be wider.

According to a preferred embodiment, the buffer is made of an inverter having a single input or two inputs. When inverters with two inputs are used, the inverters are activated only after level changes of both inputs are established, so that the variable delay circuit can reduce the time difference between output signals whose states constitute logical complements of one another. Such an inverter may be formed by a depletion type field effect transistor and an enhancement type field effect transistor, coupled in series between a power supply and a ground level. During a transition from one level to the other, both transistors at the same time become either off or on, so that the inverter does not adequately drive the output level until level changes of both inputs are established.

BRIEF DESCRIPTION OF THE DRAWINGS

The above and other objects and features of the invention are apparent to those skilled in the art from the following preferred embodiments thereof when considered in conjunction with the accompanied drawings, in which:

FIGS. 6a–6f are time chart showing operation of the variable delay circuit in FIG. 4.

DETAILED DESCRIPTION OF THE PREFERRED EMBODIMENTS

Figure 1:
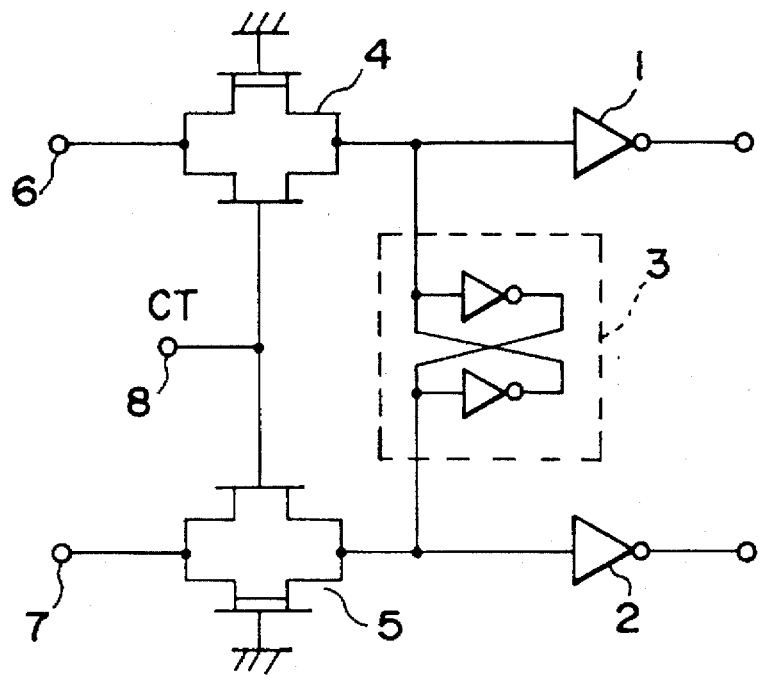
FIG. 1 is a circuit diagram illustrating a conventional variable delay circuit.
Figure 2:
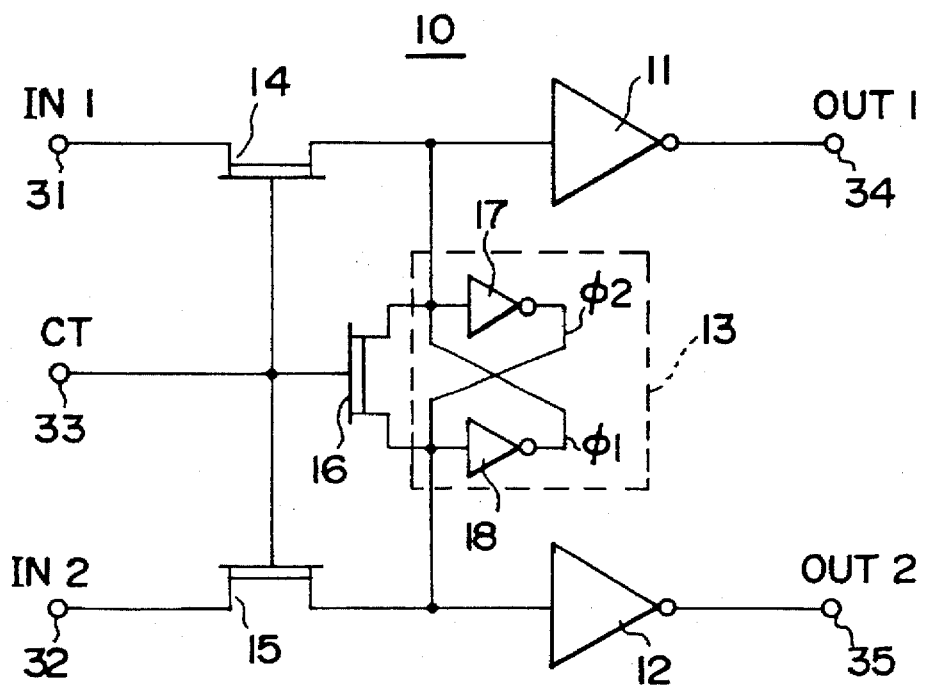
FIG. 2 is a circuit diagram illustrating a variable delay circuit according a first preferred embodiment of the invention.
Figure 3:
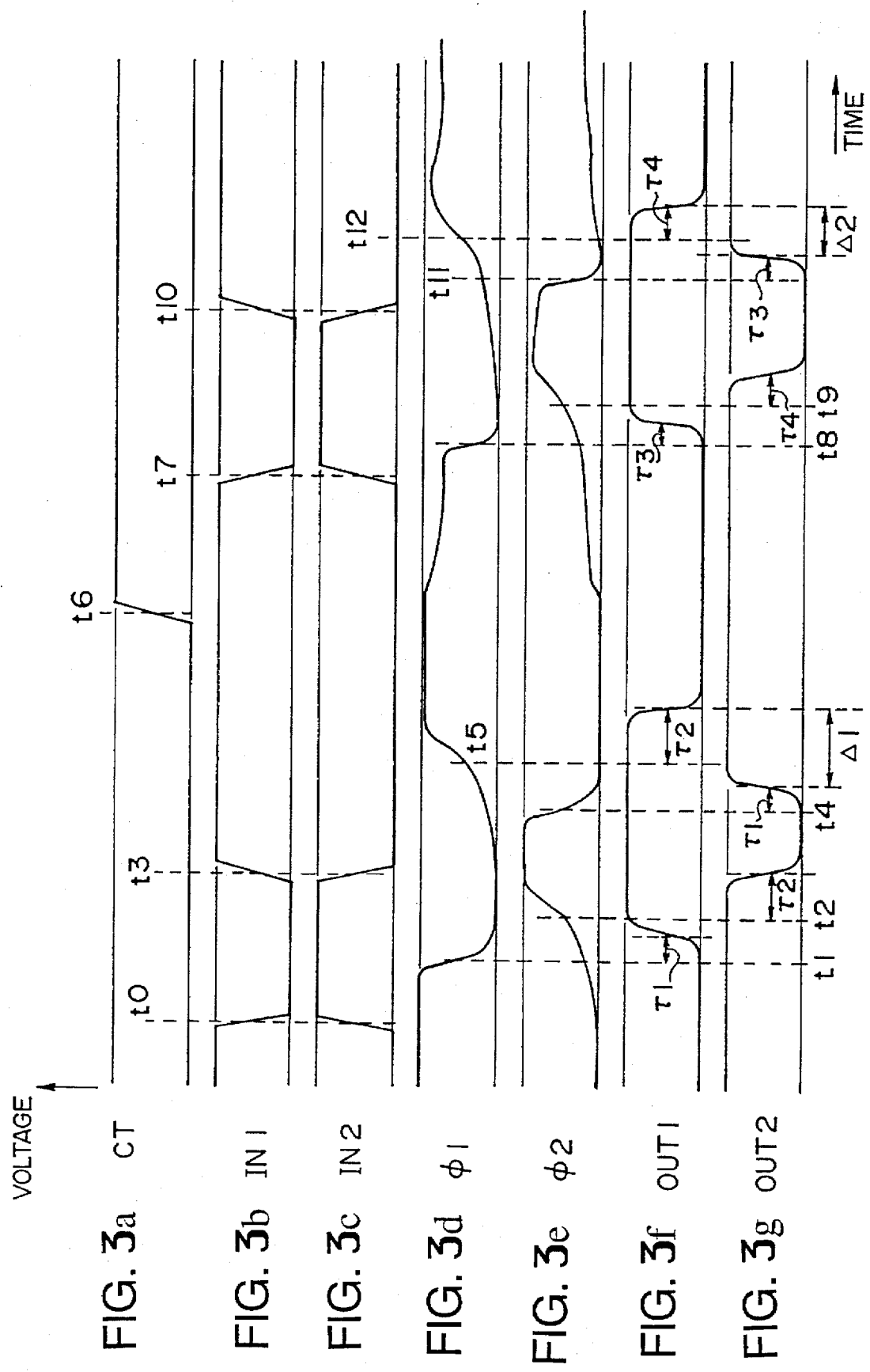
FIGS. 3a–3g are time chart showing operation of the variable delay circuit in FIG. 2.

Referring to the drawings in detail, in particular, to FIGS. 2, 3, a variable delay circuit 10 according to a preferred embodiment of the invention is shown. This variable delay circuit 10 is used for an optical fiber telecommunication system which requires sub-nanosecond phase adjustments between a clock signal and a data signal. The variable delay circuit 10, together with other circuits is formed on a GaAs IC chip.

The variable delay circuit 10 is constituted of two transfer gates made of D-FETs 14, 15, a latch circuit 13 for holding and driving levels, a pair of inverters 11, 12 for outputs, and another D-FET 16. The gates of the D-FETs 14, 15 are commonly coupled to a terminal 33 for control signal CT. One of the source and drain of the D-FET 14 is coupled to an input terminal 31 for receiving an input signal IN1 to be delayed by this delay circuit; the other of the source and drain of the D-FET 14 is coupled to the input of the inverter 11. One of the source and drain of the D-FET 15 is coupled to an input terminal 32 for receiving an input signal IN2 having the inverted level of the input signal IN1; the other of the source and drain of the D-FET 15 is coupled to the input of the inverter 12. The input signals IN1, IN2 are binary signals whose state becomes logical complements of one another. The D-FETs 14, 15 transfer the input signals IN1, IN2 from one of the source and drain thereof to the other of the source and drain thereof. The impedance of the D-FETs 14, 15 is changed according the level changes of the control signal CT. When the control signal CT is a high level, the input signals IN1, IN2 quickly pass through the D-FETs 14, 15, since the impedance of the D-FETs 14, 15 is low. In contrast, when the control signal CT is a low level, the input signals IN1, IN2 slowly pass through the D-FETs 14, 15, since the impedance of the D-FETs 14, 15 is high.

The latch circuit 13 is composed of a pair of inverters 17, 18 cross-coupled to each other. That is, the input of the inverter 17 is coupled to the output of the inverter 18 and to the other of the source and drain of the D-FET 14; the input of the inverter 18 is coupled to the output of the inverter 17 and to the other of the source and drain of the D-FET 15.

The D-FET 16 is coupled between the inputs of the latch circuit 13. One of the source and drain of the D-FET 16 is coupled to the input of the inverter 17; the other of the source and drain of the D-FET 16 is coupled to the input of the inverter 18. The gate of the D-FET 16 is coupled to the terminal 33 for the control signal CT, so that the impedance of the D-FET 16 is controlled by the control signal CT. When the control signal CT is the high level, the level difference between two inputs of the latch circuit 13 becomes small, because of low impedance of the D-FET, otherwise it is large. The impedance of the D-FET 16 is designed so that the load current of the inverters 17, 18 never exceeds the maximum limitation amount of the inverters 17, 18 even if the level of the control signal CT shifts, for example, from GND level (=0 V) to VDD level.

The pair of inverters 11, 12 serves as buffers for outputs. In the design, the gate width of the FETs of the inverters 11, 12 is set three times or more larger than the gate width of the FETs of the inverters 17, 18. The output of the inverter 11 is coupled to an output terminal 34 for feeding an output signal OUT1; the output of the inverter 12 is coupled to an output terminal 35 for feeding an output signal OUT2.

In operation, as shown in FIGS. 3a–3g, where the control signal CT is at the low level, the input signal IN1 shifts from the high level to the low level and the input signal IN2 shifts from the low level to the high level, at time t0. Those level shifts of the input signals IN1, IN2 are transferred through the D-FETs 14, 15 to the inputs of the latch circuit 13. Since the D-FETs 14, 15 are in the high impedance state according to the level of the control signal CT, the input signals IN1, IN2 slowly pass through the D-FETs 14, 15. The D-FET 16 is also in the high impedance state, so that the latch circuit 13 keeps the level difference between the two inputs thereof. While the level changes given to the latch circuit 13 are still small, the inverters 17, 18 are reluctant to flip their levels. However, once the input level surpasses the threshold level of the inverters 17, 18, the inverters 17, 18 vigorously change their output levels. Though the inverters 17, 18 are made in the same size, the inverter 18 begins to pull down the output Ø1 thereof at time t1 before the inverter 17 begins to pull up the output Ø2 thereof at time t2, because those inverters 17, 18 are more sensitive to increasing of input levels than to decreasing of input levels.

As the inverter 18 pulls down the input level of the inverter 11, the output of the inverter 11 shifts from the low level to the high level at the end of period of time τ1 after time t1. Subsequently, the output of the inverter 12 shifts from the high level to the low level at the end of period of time τ2 after time t2. Even if the input signals IN1, IN2 are changed at the same time, the output signals OUT1, OUT2 are not changed at the same time, and time difference remains.

At time t3, when the input signal IN1 changes from the low level to the high level and at the same time the input signal IN2 changes from the high level to the low level, those signals IN1, IN2 are transmitted through the D-FETs 14, 15 in the same manner described above. In this case, since the inverter 17 acts upon increasing of the input level, the inverter 17 first pulls down the output Ø2, and subsequently, the inverter 18 begins to pull up the output Ø1. The output signal OUT2 changes from the low level to the high level at the end of period of time τ1 after time t4; the output signal OUT1 changes from the high level to the low level at the end of period of time τ2 after time t5. As a result, where the control signal CT is at the low level, there is time difference Δ1 between the changes of output signals OUT1, OUT2.

On the other hand, when the level of the control signal CT becomes high, all the D-FETs 14, 15, 16 enter in the low impedance state. Consequently, the latch circuit 13 can flip quickly with a relatively larger amount of current flowing through the latch circuit 13. As shown in FIGS. 3a–3g, if the control signal CT shifts from the low level to the high level at time t6, the D-FETs 14, 15, 16 become low in impedance. The D-FET 16 when the control signal CT is high serves for reducing the voltage difference between the two inputs of the latch circuit 13. That is, where the input signal IN1 is at the high level and the input signal IN2 is the low level, the output Ø1 is pulled down a little by the inverter 17 through the conducting D-FET 16, and at the same time, the output Ø2 is pulled up a little by the inverter 18 through the conducting D-FET 16. The levels of the outputs Ø1, Ø2 are determined in the proportion of impedance of the D-FET against impedance of the inverters 18, 17. Then, when the input signals IN1, IN2 shift at time t7 to the low level and to the high level, respectively, the inverters 17, 18 are activated to render the outputs Ø1, Ø2 low and high, respectively. Though the inverter 18 first becomes active, and subsequently, the inverter 17 becomes so, those inverters 17, 18 quickly responds to the level shifts of the inputs of the latch circuit 13, because the level difference between the inputs of the latch circuit 13 is already reduced by the conducting D-FET 16 that has been made low impedance by the control signal CT. The output of the inverter 11 shifts from the low level to the high level at the end of period of time τ3 after time t8. Subsequently, the output of the inverter 12 shifts from the high level to the low level at the end of period of time τ4 after time t9.

When the input signals IN1, IN2 shift from the low level to the high level and from the high level to the low level at time t10, respectively, the latch circuit 13 holds the signals in substantially same manner described above. In this case, the inverter 17 first begins to pull down the level of the output Ø2, and then, the inverter 18 begins to pull up the level of the output Ø2. Since the D-FET 16 is conducting with low impedance, the level difference between inputs of the latch circuit 13 is reduced, so that each of the inverters 17, 18 can quickly drive the output level. The output of the inverter 12 shifts from the low level to the high level at the end of period of time τ3 after time t11. Subsequently, the output of the inverter 11 shifts from the high level to the low level at the end of period of time τ4 after time t12. The time difference Δ2 between the changes of output signals OUT1, OUT2 where the control signal CT is at the high level becomes smaller than the time difference Δ1 where the control signal CT is at the low level. The time difference Δ2 can be much smaller when the D-FET 16 has significantly low impedance in comparison with impedance of the impedance of inverters 17, 18 and the D-FETs 14, 15.

As described above, in this embodiment, because the D-FET 16 allows the level at the latch circuit 13 to shift quickly, the latch circuit 13 can easily change its state to the opposite state with small necessary energy. The variable delay circuit 10 can set the minimum delay time smaller than that of the conventional circuit, so that the variable delay circuit 10 can establish the amount of signal delay in a wide range. Notedly, the energy required for changing the state of the latch circuit is energy for charging capacity of the gates and interconnections of the FETs in the latch circuit 13. According to the level of the control signal CT, the impedance of the D-FET 16 can be controlled so as to reduce or minimize the time difference between the two outputs OUT1, OUT2 of the variable delay circuit 10. The transfer gates of the variable delay circuit use only one transistor for each gate, so that the total number of the elements can be reduced to such as 11 elements and so that the variable delay circuit can be favorable to highly integrated circuit.

Referring to FIGS. 4, 5 and 6a–6f, another variable delay circuit 10a according to a second preferred embodiment is shown. Portions of the variable delay circuit 10a common to the portions of the variable delay circuit 10 are given the same reference numbers, and their detailed descriptions are omitted for the sake of simplicity. Inverters 21, 22 are two-input type instead of the single end type in the first embodiment. One input of the inverter 21 is coupled to the other of the source and drain of the D-FET 14 and to the output of the inverter 18; the other input of the inverter 21 is coupled to the output of the inverter 17. One input of the inverter 22 is coupled to the other of the source and drain of the D-FET 15 and to the output of the inverter 17; the other input of the inverter 21 is coupled to the output of the inverter 18.

Figure 4:
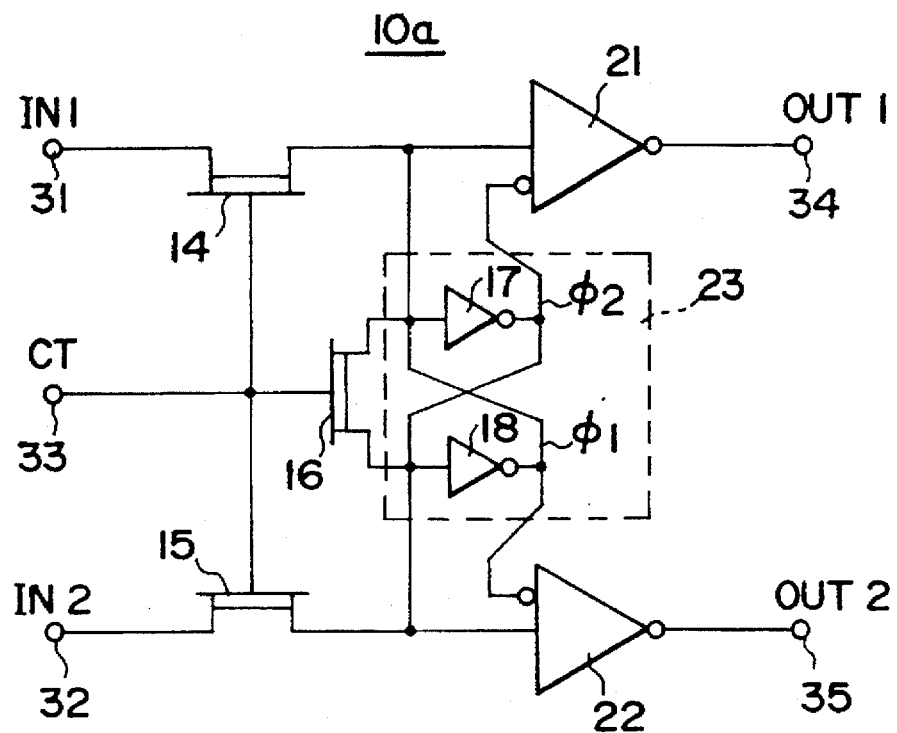
FIG. 4 is a circuit diagram illustrating a variable delay circuit according a second preferred embodiment of the invention.
Figure 5:
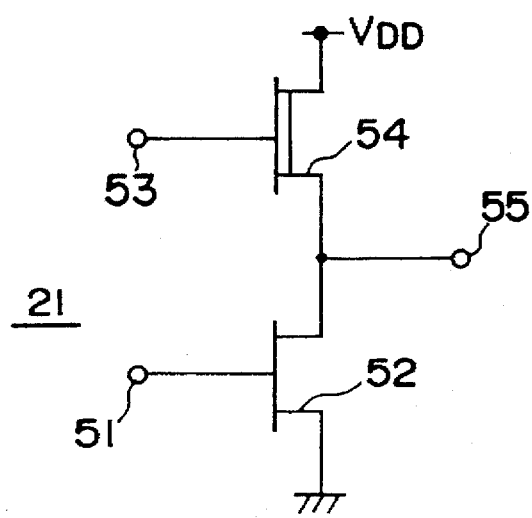
FIG. 5 is a circuit diagram illustrating an inverter in the variable delay circuit in FIG. 4.

FIG. 5 shows circuitry of the inverter 21 in FIG. 4. A D-FET 54 and an E-FET 52 are connected in series between the power supply VDD and the ground GND. The gate 51 of the E-FET 52 is coupled to the output of the inverter 18. The gate 53 of the D-FET 54 is coupled to the output of the inverter 17. The source of the D-FET 54 and the drain of the E-FET are commonly connected to an output terminal 55 which constitutes the output terminal 34 for feeding the signal OUT1. Notedly, the inverter 22 has the same constitution except that the gate 53 is coupled to the output of the inverter 18 and that the gate 51 is coupled to the output of the inverter 17.

This variable delay circuit according to the second embodiment can precisely and coincidentally produce output signals whose state constitutes a logical complement of one another, though in the first embodiment as described above the time difference between the outputs may remain even if the input signals IN1, IN2 shift at the same time where the latch circuit 13 has different sensitivity between a transition from the high level to the low level and a transition from the low level to the high level.

In operation, the input signal IN1 shifts at time t21 from the high level to the low level, and at the same time, time t21, the input signal IN2 shifts from the low level to the high level. In the latch circuit 23, the inverter 18 first pulls down the output level Ø1, and subsequently, the inverter 17 pulls up the output level Ø2. After the inverter 18 pulls down the output level Ø1 and before the inverter 17 pulls up the output level Ø2, the E-FET 52 in the inverter 21 is turned off but the D-FET 54 in the inverter 21 is still in the high impedance state, so that the output signal OUT1 is reluctantly shifted to the high level. After the inverter 17 pulls up the output level Ø2, the D-FET 54 now becomes the low impedance state, and therefore the D-FET 54 allow the current to flow into the output terminal 34 to make the output signal OUT1 at the high level. When the D-FET 54 in the inverter 21 becomes the low impedance state, the E-FET 52 in the inverter 22 is also turned on to shift the output signal OUT2 to the low level. That is, unless both the output levels Ø1, Ø2 are adequately shifted, the level shifts of the output signals OUT1, OUT2 do not come out of the inverters 21, 22. Consequently, when both the output levels Ø1, Ø2 are adequately shifted at a time, the inverters 21, 22 now begin to change their output signals, so that at time t22 the output signals OUT1, OUT2, both, shift to the respective levels. When the input signals IN1, IN2 shift in the opposite ways at time 23, the output signals OUT1, OUT2 shift in the similar manner at the same time, at time t24.

As described above, the variable delay circuit 10a uses two-input type inverters 21, 22 which allow the output signals change only after both outputs of the latch circuit 23 are established, so that the variable delay circuit 10a can nullify the time difference between the output signals OUT1, OUT2.

As described above, according to the variable delay circuit of the first embodiment, the D-FET coupled between the inputs of the latch circuit allows the level at the latch circuit to quickly shift, so that the control signal is able to control the minimum delay time smaller than that of the conventional, and so that the variable range of delay time becomes wider. According to the second embodiment, the delay circuit uses two-input inverters that become active only after two complementary outputs of the latch circuit are established, so that time difference between the outputs of the delay circuit is nullified or reduced.

It is to be noted that although only the variable delay circuit solely formed is described in the embodiments above, a plurality of the variable delay circuits can be connected in series to produce a larger amount of delay time. The variable delay circuit can be used as a ring oscillator with variable oscillation frequency by connecting the non-inverted input with the inverted output of one or more of the variable delay circuits. The D-FETs 14, 15 and 16 can be made of E-FETs, where the control signal CT controls the impedance of the E-FET. Where the inverters 21, 22 of the second embodiment are constituted of a DCFL using schottky gate type FETs and where plural variable delay circuits using such inverters are connected in series, the delay circuit can reduce deviations of delay amounts due to fluctuations of the power supply VDD because the high level of the output signal of the inverters 21, 22 is fixed to a constant voltage thereby rendering the logical swings constant.

It is understood that although the present invention has been described in detail with respect to preferred embodiments thereof, various other embodiments and variations are possible to those skilled in the art which fall within the scope and spirit of the invention, and such other embodiments and variations are intended to be covered by the following claims.

What is claimed is:

1. A variable delay circuit for delaying, based on a control signal, a pair of input signals whose states constitute logical complements of one another, comprising:

a pair of transfer gates, each of which has impedance controlled by said control signal, and each of which has one end coupled to a corresponding input terminal for receiving a respective one of the input signals;

a latch circuit, including a pair of inverters cross-coupled to each other, having two inputs, one input coupled to the other end of one of said transfer gates and the other input coupled to the other end of the other of said transfer gates;

a pair of buffers having inputs respectively coupled to the other ends of said transfer gates, for feeding output signals; and a transistor coupled between said two inputs of said latch circuit for controlling, according to said control signal, time needed for said latch circuit to change state.

2. A variable delay circuit for delaying, based on a control signal, a pair of input signals whose states constitute logical complements of one another, comprising:

a pair of transfer gates, each of which has impedance controlled by said control signal, and each of which has one end coupled to a corresponding input terminal for receiving a respective one of the input signals;

a latch circuit, including a pair of inverters cross-coupled to each other, having two inputs, one input coupled to the other end of one of said transfer gates and the other input coupled to the other end of the other of said transfer gates;

a pair of buffers having inputs respectively coupled to the other ends of said transfer gates, for feeding output signals, wherein each of said buffers is an inverter having two inputs, one of which is coupled to one of said inputs of said latch circuit, and the other of which is coupled to the other of said inputs of said latch circuit; and a transistor coupled between said two inputs of said latch circuit for controlling, according to said control signal, time needed for said latch circuit to change state.

3. The variable delay circuit as set forth in claim 1, wherein each of said pair of transfer gates is made of a depletion type field effect transistor.

4. The variable delay circuit as set forth in claim 1, wherein each of said pair of transfer gates is made of an enhancement type field effect transistor.

5. The variable delay circuit as set forth in claim 1, wherein each of said buffers is an inverter having a single input.

6. The variable delay circuit as set forth in claim 1, wherein transistors constituting each of said buffers have a gate width three times larger than that of transistors of each of said inverters of said latch circuit.

7. The variable delay circuit as set forth in claim 2, wherein each of said pair of transfer gates is made of a depletion type field effect transistor.

8. The variable delay circuit as set forth in claim 2, wherein each of said pair of transfer gates is made of an enhancement type field effect transistor.

9. The variable delay circuit as set forth in claim 2, wherein transistors constituting each of said buffers have a gate width three times larger than that of transistors of each of said inverters of said latch circuit.

10. The variable delay circuit as set forth in claim 1, wherein the control signal has a fixed value.

* * * * *